(12) United States Patent
Ishihama et al.

(10) Patent No.: US 11,598,565 B2
(45) Date of Patent: Mar. 7, 2023

(54) COOLING APPARATUS HAVING MULTIPLE EVAPORATORS FOR COOLING OBJECTS HAVING DIFFERENT AMOUNTS OF HEAT GENERATION, EXPOSURE APPARATUS INCLUDING COOLING APPARATUS, AND INDUSTRIAL APPARATUS INCLUDING COOLING APPARATUS

(71) Applicant: CANON SEMICONDUCTOR EQUIPMENT INC., Ibaraki (JP)

(72) Inventors: Hitoshi Ishihama, Ibaraki (JP);
Masakazu Nagata, Ibaraki (JP);
Yuusuke Suzuki, Ibaraki (JP)

(73) Assignee: CANON SEMICONDUCTOR EQUIPMENT INC., Ibaraki (JP)

( * ) Notice: Subject to any disclaimer, the term of this patent is extended or adjusted under 35 U.S.C. 154(b) by 0 days.

(21) Appl. No.: 17/102,937

(22) Filed: Nov. 24, 2020

(65) Prior Publication Data
US 2021/0080164 A1   Mar. 18, 2021

Related U.S. Application Data

(63) Continuation of application No. PCT/JP2019/019811, filed on May 17, 2019.

(30) Foreign Application Priority Data

May 28, 2018  (JP) .............................. JP2018-101541

(51) Int. Cl.
*F25B 5/04*  (2006.01)
*F25B 39/00*  (2006.01)
(Continued)

(52) U.S. Cl.
CPC .............. *F25B 49/022* (2013.01); *F25B 5/04* (2013.01); *F25B 7/00* (2013.01); *F25B 39/00* (2013.01);
(Continued)

(58) Field of Classification Search
CPC ................ F25B 7/00; F25B 2313/0254; F25B 2400/0403; F25B 2400/0409;
(Continued)

(56) References Cited

U.S. PATENT DOCUMENTS 4,918,942 A * 4/1990 Jaster ........................ F25B 1/10
62/335
5,183,101 A   2/1993 Penaluna et al.
(Continued)

FOREIGN PATENT DOCUMENTS

CN         201355150         12/2009
CN         201355150 Y  * 12/2009   .............. F25B 41/04
(Continued)

OTHER PUBLICATIONS

International Search Report dated Jul. 9, 2019 in International (PCT) Application No. PCT/JP2019/019811.

*Primary Examiner* — Jerry-Daryl Fletcher
*Assistant Examiner* — Daniel C Comings
(74) *Attorney, Agent, or Firm* — Wenderoth, Lind & Ponack, L.L.P.

(57) ABSTRACT

A cooling apparatus includes a compressor, a first flow path and a second flow path branched from a branch point, a condenser disposed downstream of the branch point in the first flow path, a first decompressor disposed downstream of the condenser, a plurality of evaporators disposed downstream of the first decompressor and connected in series, a second decompressor disposed downstream of the branch point in the second flow path, a detection unit, and a control unit. The second flow path includes a hot-gas flow path configured to connect an outlet of the second decompressor and a meeting point with the first flow path. The control unit controls a degree of opening of the second decompressor depending on the temperature detected by the first temperature-detection unit and controls a degree of opening of the
(Continued)

first decompressor depending on the temperature and/or the pressure detected by the detection unit.

14 Claims, 8 Drawing Sheets

(51) Int. Cl.
*F25B 49/02* (2006.01)
*F25B 41/20* (2021.01)
*F25B 41/40* (2021.01)
*F25B 7/00* (2006.01)

(52) U.S. Cl.
CPC .............. *F25B 41/20* (2021.01); *F25B 41/40* (2021.01); *F25B 2313/02321* (2013.01); *F25B 2313/02341* (2013.01); *F25B 2400/0403* (2013.01); *F25B 2400/0409* (2013.01); *F25B 2600/02* (2013.01); *F25B 2700/21* (2013.01)

(58) Field of Classification Search
CPC .......... F25B 2400/0411; F25B 2700/21; F25B 2700/2117; F25B 2313/02541; F25B 2339/02; F25B 5/04; F25B 2313/0232; F25B 2313/02321; F25B 2313/0234; F25B 2313/02341
See application file for complete search history.

(56) References Cited

U.S. PATENT DOCUMENTS

| | | | |
|---|---|---|---|
| 6,311,506 B1 | 11/2001 | Takahashi et al. | |
| 6,370,895 B1* | 4/2002 | Sakuma | F25D 11/022 62/199 |
| 9,278,303 B1* | 3/2016 | Somani | F24F 6/14 |
| 9,557,084 B2* | 1/2017 | Thogersen | F24F 3/1405 |
| 2005/0183432 A1 | 8/2005 | Cowans et al. | |
| 2005/0235667 A1* | 10/2005 | Bae | F25B 5/04 62/157 |
| 2006/0005558 A1* | 1/2006 | Otake | F25B 13/00 62/260 |
| 2009/0260379 A1* | 10/2009 | Kim | F25D 11/022 62/515 |
| 2015/0168024 A1* | 6/2015 | Lee | F25D 21/006 62/511 |
| 2015/0168040 A1* | 6/2015 | Kang | F25B 5/04 62/186 |
| 2016/0084553 A1 | 3/2016 | Seki et al. | |

FOREIGN PATENT DOCUMENTS

| | | | |
|---|---|---|---|
| CN | 203642421 | 6/2014 | |
| JP | 63-144557 | 9/1988 | |
| JP | 2000-28208 | 1/2000 | |
| JP | 2008-501927 | 1/2008 | |
| JP | 2010-145036 | 7/2010 | |
| JP | 2015-158305 | 9/2015 | |
| JP | 2018-4169 | 1/2018 | |
| JP | 2018004169 A * | 1/2018 | ............... F25B 1/00 |

* cited by examiner

COOLING APPARATUS HAVING MULTIPLE EVAPORATORS FOR COOLING OBJECTS HAVING DIFFERENT AMOUNTS OF HEAT GENERATION, EXPOSURE APPARATUS INCLUDING COOLING APPARATUS, AND INDUSTRIAL APPARATUS INCLUDING COOLING APPARATUS

CROSS-REFERENCE TO RELATED APPLICATIONS

This application is a Continuation of International Patent Application No. PCT/JP2019/19811, filed May 17, 2019, which claims the benefit of Japanese Patent Application No. 2018-101541, filed May 28, 2018, which is hereby incorporated by reference herein in its entirety.

BACKGROUND OF THE INVENTION

Field of the Invention

The present invention relates to a cooling apparatus that includes a plurality of evaporators and cools a plurality of objects at the same time. In particular, the present invention relates to a cooling apparatus suitably used for an industrial apparatus that includes a plurality of heat-generating elements having different amounts of heat generation.

Description of the Related Art

In recent years, industrial apparatuses that include a plurality of heat-generating elements having different amounts of heat generation are increasingly used. Examples of the industrial apparatuses include a semiconductor manufacturing apparatus such as an exposure device, a laser machining device, and a flat-panel display manufacturing apparatus. For example, the exposure device for manufacturing semiconductors includes components such as an optical system including a light source, a motor, a control circuit, and a power supply; and the components can be regarded as a plurality of heat-generating sources having different amounts of heat generation. For stably operating such an industrial apparatus in its normal state, it is necessary to use a cooling apparatus that can appropriately cool the plurality of heat-generating sources and their surroundings in accordance with respective amounts of heat generation.

Japanese Unexamined Utility Mode Application Publication No. S63-144557 describes a cooling apparatus that can cool a plurality of objects. In this apparatus, a compressor and a condenser are disposed in series in this order, and a coolant flow path is split into two flow paths on the downstream side of the condenser. In each flow path, a decompressor and an evaporator are disposed in series. Thus, the cooling apparatus has two refrigeration cycles formed in parallel.

In one of the two refrigeration cycles, the downstream side of the compressor and the upstream side of the evaporator are connected with each other via a hot-gas bypass that includes an electromagnetic valve and a pressure regulation valve. In the other refrigeration cycle having no hot-gas bypass, an electromagnetic valve similar to that of the hot-gas bypass is disposed between the condenser and the evaporator. The degree of opening of each of the two electromagnetic valves is adjusted in accordance with a temperature detected by a detection unit that detects the temperature of an object to be cooled, and thereby the cooling capacity of the evaporator is adjusted so that the temperature of the object is kept within a predetermined range.

By the way, the cooling apparatus used for cooling the industrial apparatus such as a semiconductor manufacturing apparatus or a laser machining device is required to have a small size, stable cooling capacity, low cost, and good operability.

Since the apparatus described in Japanese Unexamined Utility Mode Application Publication No. S63-144557 operates two evaporators by using a single compressor and a single condenser, it can be said that the apparatus can be downsized compared to a configuration in which two cooling apparatuses each having a single compressor, a single condenser, and a single evaporator are disposed in parallel.

However, since the apparatus needs decompressors having the same number as that of evaporators, it is difficult to say that the apparatus is sufficiently downsized and has sufficiently low cost.

In addition, there is a case in which the evaporators have different outlet pressures caused by the difference in the amount of heat of each heat source. In this case, at a meeting point downstream of the evaporators connected in parallel with each other, the flow of the coolant may fluctuate due to the difference in pressure, possibly causing unstable cooling capacity and lowering controllability of adjusting temperature.

Furthermore, if a secondary side (heat source) of an evaporator stops, sufficient evaporation will not occur, and thus the coolant that contains an excessive amount of liquid-phase coolant will continuously return to the compressor, so that the compressor may take in a large amount of liquid-phase coolant and break down. In this case, since the coolant flow to the evaporator (the heat source of which has stopped) has to be stopped by closing the valve, the operation is inconvenient.

SUMMARY OF THE INVENTION

According to a first aspect of the present invention, a cooling apparatus includes a compressor configured to compress coolant, a first flow path and a second flow path branched from a branch point, the branch point being disposed downstream of the compressor and configured to split compressed coolant toward the first and second flow paths, a condenser disposed downstream of the branch point in the first flow path and configured to condense compressed coolant, a first decompressor disposed downstream of the condenser and configured to decompress condensed coolant, a plurality of evaporators disposed downstream of the first decompressor and connected in series with each other such that the evaporators cool different objects to be cooled, a second decompressor disposed downstream of the branch point in the second flow path and configured to decompress compressed coolant, a return path configured to return coolant that flows out of the most downstream evaporator of the plurality of evaporators, to the compressor, a first temperature-detection unit configured to detect a temperature of an object cooled by the most downstream evaporator of the plurality of evaporators, a detection unit configured to detect a temperature and/or a pressure of the coolant that flows out of the most downstream evaporator of the plurality of evaporators, and a control unit. The second flow path includes a hot-gas flow path configured to connect an outlet of the second decompressor and a meeting point with the first flow path. The meeting point is positioned upstream of a most downstream evaporator of the plurality of evaporators. The control unit is configured to control a degree of opening of the second decompressor depending on the temperature detected by the first temperature-detection unit and control a degree of opening of the first decompressor depending on the temperature and/or the pressure detected by the detection unit.

According to a second aspect of the present invention, a cooling apparatus includes a compressor configured to compress coolant, a first flow path and a second flow path branched from a branch point, the branch point being disposed downstream of the compressor and configured to split compressed coolant toward the first and second flow paths, a condenser disposed downstream of the branch point in the first flow path and configured to condense compressed coolant, a first decompressor disposed downstream of the condenser and configured to decompress condensed coolant, a plurality of evaporators disposed downstream of the first decompressor and connected in series with each other such that the evaporators cool different objects to be cooled, a second decompressor disposed downstream of the branch point in the second flow path and configured to decompress compressed coolant, a return path configured to return coolant that flows out of the most downstream evaporator of the plurality of evaporators, to the compressor, a first temperature-detection unit configured to detect a temperature of an object cooled by the most downstream evaporator of the plurality of evaporators, a detection unit configured to detect a temperature and/or a pressure of the coolant that flows out of the most downstream evaporator of the plurality of evaporators, and a control unit. The second flow path includes a hot-gas flow path configured to connect an outlet of the second decompressor and a meeting point with the first flow path. The meeting point is positioned upstream of a most downstream evaporator of the plurality of evaporators. The control unit is configured to control a degree of opening of the second decompressor depending on the temperature detected by the first temperature-detection unit and on the temperature and/or the pressure detected by the detection unit.

Further features of the present invention will become apparent from the following description of exemplary embodiments with reference to the attached drawings.

DESCRIPTION OF THE EMBODIMENTS

First Embodiment

Hereinafter, a cooling apparatus of a first embodiment of the present invention will be described with reference to the accompanying drawings.

Figure 1:
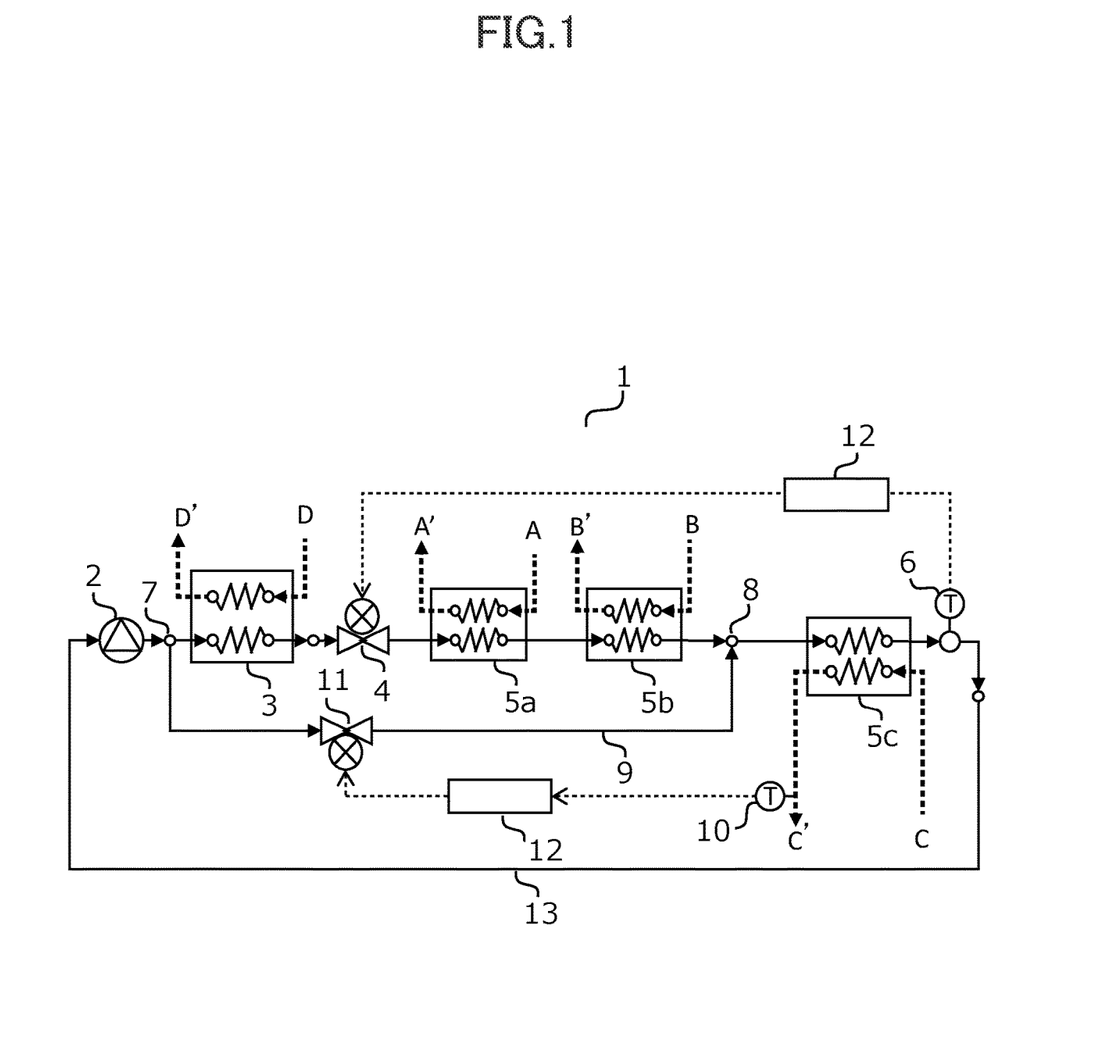
FIG. 1 illustrates a configuration of a cooling apparatus of a first embodiment.

A cooling apparatus 1 of the first embodiment illustrated in FIG. 1 has a refrigeration cycle in which a compressor 2, a condenser 3, a decompressing unit 4, an evaporator 5a, an evaporator 5b, and an evaporator 5c are disposed in series with each other via a coolant pipe. In FIG. 1, the direction in which the coolant flows through the coolant pipe is indicated by solid arrows. Note that the refrigeration cycle described herein means a cycle in which the coolant circulates, while changing its state, through the compressor, the condenser, the decompressor (expansion valve), and the evaporators in this order for performing functions of the cooling apparatus; and thus, does not necessarily mean that the cycle is involved with freezing.

The compressor 2 takes in the coolant, changes the coolant into a high-temperature and high-pressure gas by compressing the coolant, and discharges the gas toward a downstream direction. Note that the compressor 2 may include a gas-liquid separator (not illustrated) disposed in front of an inlet of the compressor 2.

The high-temperature and high-pressure gasified coolant discharged from the compressor 2 splits at a branch point 7 positioned downstream of the compressor 2, and flows into a first flow path extending toward the condenser 3 and a second flow path extending toward a decompressing unit 11.

The condenser 3 cools and condenses the high-temperature and high-pressure gasified coolant discharged from the compressor 2, by flowing a cooling liquid through D-D'. The liquefied coolant condensed by the condenser 3 flows into the decompressing unit 4 through the coolant pipe. The decompressing unit 4 is a first decompressor. Note that although not illustrated, a liquid receiver may be disposed between the condenser 3 and the decompressing unit 4.

The decompressing unit 4 is a decompressor that changes the state of the high-pressure liquefied coolant, condensed by the condenser 3, into a gas-liquid mixed state by decompressing the liquefied coolant. On the downstream side of the decompressing unit 4, the plurality of evaporators is connected in series with each other. Although the evaporators 5a, 5b, and 5c are connected with each other in FIG. 1, the number of evaporators connected in series is not limited to three.

In each evaporator, the gas-liquid mixed coolant decompressed by the decompressing unit 4 draws heat away from an object to be cooled, and thereby cools the object. Specifically, the evaporator 5a draws heat away from an incoming high-temperature object A to be cooled, and discharges a cooled object A'. Similarly, the evaporator 5b draws heat away from an incoming high-temperature object B to be cooled, and discharges a cooled object B', and the evaporator 5c draws heat away from an incoming high-temperature object C to be cooled, and discharges a cooled object C'. In these operations, the coolant keeps its gas-liquid two-phase (mixed) state or gas state in a period of time from when the coolant flows into the most upstream evaporator 5a, until when the coolant flows out of the most downstream evaporator 5c. The gasified coolant that flows out of the most downstream evaporator 5c returns to the inlet of the compressor 2 through a return path 13.

A detection unit 6 for detecting the temperature and/or the pressure of the coolant is disposed downstream of the most downstream evaporator 5c, and detects either the temperature or the pressure, or both the temperature and the pressure of the coolant that flows out of the evaporator 5c and flows into the compressor 2. Preferably, the detection unit 6 is a temperature sensitive cylinder or a pressure sensor, for example. The information on the temperature and/or the pressure of the coolant detected by the detection unit 6 is sent to the control unit 12, and thereby the control unit 12 detects a degree of superheat of the coolant that flows out of the evaporator 5c. In the present embodiment, the outlet pressure of the decompressing unit 4 is adjusted so that the degree of superheat of the coolant is kept within a predetermined range. For this purpose, the control unit 12 sends a control signal to the decompressing unit 4 and adjusts the degree of opening of the outlet. Note that the control unit 12 may create and store a table in advance that indicates a relationship between the value detected by the detection unit 6 and the degree of opening of the decompressing unit 4 (the degree of opening is adjusted in accordance with the value detected by the detection unit 6, to keep the degree of superheat of the coolant within the predetermined range). In this case, the control unit 12 can similarly control the decompressing unit 4 without detecting a degree of superheat from a detected value.

In addition, in the present embodiment, a hot-gas bypass circuit 9 is disposed for connecting the branch point 7 positioned downstream of the compressor 2 and a meeting point 8 positioned upstream of the most downstream evaporator 5c. In the present embodiment, the coolant that flows out of the evaporator 5b is joined, at the meeting point 8, with a hot gas whose pressure is adjusted by the decompressing unit 11 that is a second decompressor. With this operation, the temperature of the coolant that flows into the most downstream evaporator 5c is changed, and thereby the cooling capacity of the evaporator 5c is adjusted. Specifically, the temperature of the object C' cooled by the most downstream evaporator 5c is detected by a temperature detection unit 10 that is a first temperature-detection unit, and sent to the control unit 12. The control unit 12 controls the degree of opening of the decompressing unit 11 so that the evaporator 5c cools the object C to a desired temperature.

In the present embodiment, evaporators of the plurality of evaporators other than the most downstream evaporator are used at almost constant cooling capacity, and the cooling capacity of the most downstream evaporator can be changed. Thus, in the cooling apparatus of the present embodiment, the upstream evaporators are suitable for cooling objects whose cooling loads are relatively small and vary less, and the most downstream evaporator is suitable for cooling an object whose cooling load is relatively large and varies more.

Note that although the three evaporators are disposed in FIG. 1, the number of evaporators is not limited to this example, and three or more evaporators may be disposed in series with each other as long as the coolant can keep its gas-liquid two-phase (mixed) state or gas state until flowing out of the most downstream evaporator. That is, more objects to be cooled can be handled.

Figure 2:
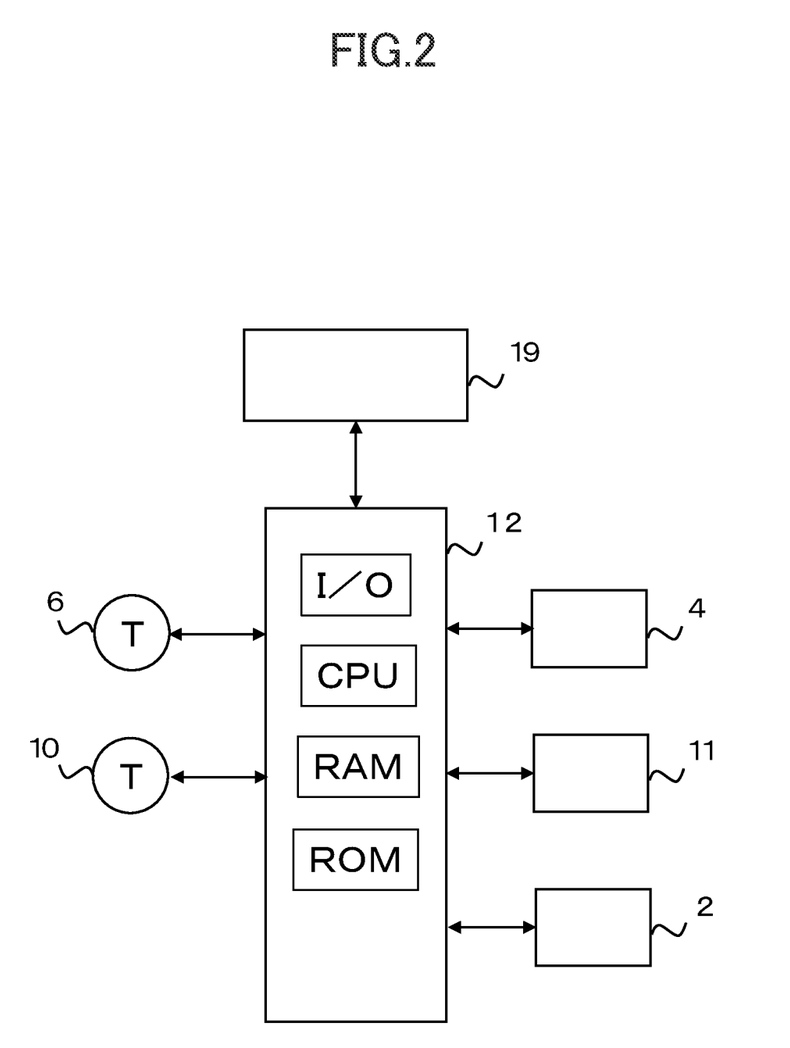
FIG. 2 is a block diagram illustrating a configuration of a control unit of the first embodiment.

Next, a control system of the cooling apparatus 1 will be described. FIG. 2 is a control block diagram simply illustrating the control system of the cooling apparatus 1. Note that FIG. 2 illustrates only one part of components controlled by the control unit, for convenience of illustration.

The control unit 12 is a computer to control the operation of the cooling apparatus 1, and includes a CPU, a ROM, a RAM, and an I/O port.

The ROM stores a basic operation program of the cooling apparatus 1. The ROM also stores a program for controlling the operation of the compressor 2, a program for a process that controls the degree of opening of the decompressing unit 4 by using the information on the temperature and/or the pressure of the coolant detected by the detection unit 6, and a program for a process that controls the degree of opening of the decompressing unit 11 by using the information on the temperature detected by the temperature detection unit 10. Note that these programs may be loaded to the RAM from the outside via a network or a computer-readable recording medium.

The I/O port of the control unit 12 is connected with an external device 19, such as an external computer, and a network. The control unit 12 can send/receive data necessary to control the cooling, to/from an external computer via the I/O port. For example, the data represents the amount of heat generation and the allowable temperature range of each unit of an industrial apparatus to be cooled by the cooling apparatus 1.

Figure 3:
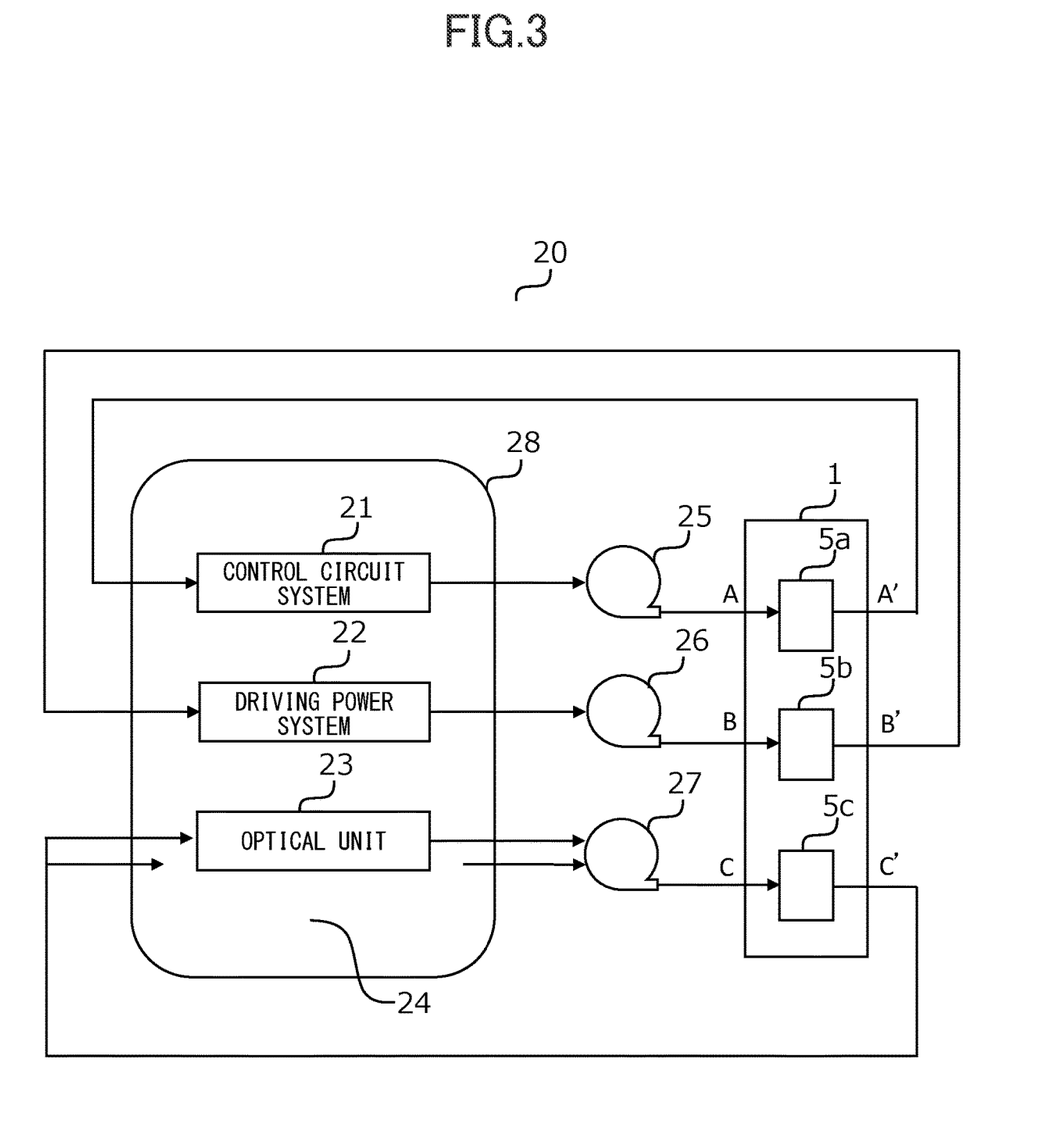
FIG. 3 illustrates a configuration of an exposure apparatus including the cooling apparatus of the first embodiment.

Next, an example of a configuration in which the cooling apparatus 1 is incorporated in an industrial apparatus for cooling each unit of the apparatus will be described. FIG. 3 is a schematic block diagram illustrating an example in which the cooling apparatus 1 of the present embodiment is incorporated in an exposure apparatus 20 that exposes fine patterns for manufacturing semiconductors.

In a chamber 28 of the exposure apparatus 20, a control circuit system 21, a driving power system 22, an optical unit 23, and the like are disposed. The control circuit system 21 may include a power source and a computer. The driving power system 22 may include a motor used for driving a stage. The optical unit 23 may include a light source and a lens-driving motor. These units are heat-generating sources. Since the exposure apparatus is required to have precise mechanical accuracy, it is important to manage temperatures of not only the units of the exposure apparatus but also an atmosphere 24 in the chamber.

In the control circuit system 21 and the driving power system 22, the amount of heat generation is relatively small, and the change in heat generation with respect to time is also small. Thus, the control circuit system 21 and the driving power system 22 are cooled by the evaporators 5a and 5b having almost constant cooling capacity and positioned upstream in the cooling apparatus 1. Specifically, the control circuit system 21 and the driving power system 22 are liquid-cooled by circulating cooling liquid by using pumps 25 and 26.

In contrast, the optical unit 23 and its surroundings have a relatively large amount of heat generation and the heat is radiated into the atmosphere in the chamber. Since the change in temperature of the optical unit 23 affects the accuracy of exposing fine patterns, it is necessary to sufficiently increase the cooling capacity and suppress the change in temperature for the optical unit 23 and the atmosphere in the chamber. For this reason, in the present embodiment, the optical unit 23 and the atmosphere in the chamber are air-cooled by sending air around the optical unit 23 and in the chamber to the evaporator 5c by using an air blower 27. The air is then cooled by the evaporator 5c, and circulated.

Referring again to FIG. 1, the operation of the cooling apparatus 1 of FIG. 3 will be described.

First, for stably operating the compressor 2, the compressor 2 is required to take in the coolant having a temperature of 35° C. or less and a pressure of 0.2 MPa or more and 1.0 MPa or less. As described later, because the coolant that returns from the evaporator 5c to the compressor 2 through the return path 13 has a pressure of about 0.8 MPa and a temperature of about 14° C., the compressor 2 can operate normally. The coolant taken in by the compressor 2 is compressed until the pressure becomes 2.3 MPa, and sent to the branch point 7, as a gas having a temperature of about 65° C.

The coolant having entered the condenser 3 from the branch point 7 performs heat exchange with the cooling liquid that flows through D-D', and is cooled into liquid having a pressure of 2.3 MPa and a temperature of 36° C. The liquid flows into the inlet of the decompressing unit 4.

In the decompressing unit 4, the degree of opening of the expansion valve is controlled by the control unit 12 so that the coolant from the evaporator 5c keeps its constant degree of superheat. The coolant that flows out of the decompressing unit 4 toward the evaporator 5a changes its state depending on the degree of opening of the expansion valve. In general, the state of the coolant is a gas-liquid two-phase (mixed) state in which the gas and the liquid have a pressure of 1.3 MPa and a temperature of about 19° C. and coexist.

The evaporator 5a has a cooling capacity of 400 W, and cools the cooling liquid of the control circuit system 21 of the exposure apparatus 20 from 25° C. to 21° C. Since the evaporator 5a produces a pressure loss of about 0.1 MPa when the coolant passes through the pipe, the temperature of the coolant drops about 3° C. in the evaporator 5a. Thus, at the outlet of the evaporator 5a, the coolant has a gas-liquid two-phase (mixed) state in which the pressure is about 1.2 MPa and the temperature is about 16° C. although the pressure and the temperature vary depending on the degree of opening of the decompressing unit 4. The coolant then flows into the evaporator 5b.

The evaporator 5b has a cooling capacity of 600 W, and cools the cooling liquid of the driving power system 22 of the exposure apparatus 20 from 25° C. to 20° C. Since the evaporator 5b produces a pressure loss of about 0.1 MPa when the coolant passes through the pipe, the temperature of the coolant drops about 3° C. in the evaporator 5b. Thus, at the outlet of the evaporator 5b, the coolant has a gas-liquid two-phase (mixed) state in which the pressure is about 1.1 MPa and the temperature is about 14° C., although the pressure and the temperature vary depending on the degree of opening of the decompressing unit 4. The coolant then flows into the meeting point 8.

At the meeting point 8, the hot gas that flows from the hot-gas bypass circuit 9, which is a hot-gas flow path, into the meeting point 8 and the coolant that flows from the evaporator 5b into the meeting point 8 join with each other. Then the hot gas and the coolant flow into the evaporator 5c.

The evaporator 5c has a cooling capacity up to 5000 W, and cools the cooling air of the optical unit 23 of the exposure apparatus 20 and the atmosphere (air) in the chamber from about 25° C. to 21.5° C. The temperature of the air that is still not cooled fluctuates around about 25° C. depending on the operating condition of the exposure apparatus 20. Thus, for controlling the temperature of the cooled air so as to be 21.5° C., the cooling capacity of the evaporator 5c is appropriately adjusted, not fixed to the constant 5000 W. Specifically, the control unit 12 causes the temperature detection unit 10 to detect the temperature of the air that is the cooled object C' having passed through the evaporator 5c, and thereby controls the degree of opening of the decompressing unit 11. In this operation, the control unit 12 adjusts the amount of the hot gas that flows from the hot-gas bypass circuit 9 and joins with the coolant, so that the temperature of the air becomes 21.5° C. When the coolant joins with the hot gas (gasified coolant) and when the coolant passes through the pipe in the evaporator, a pressure loss occurs, and the coolant flows into the evaporator in a state where the pressure is about 0.8 MPa and the temperature is about 4° C. Since the coolant is gasified at the outlet of the evaporator at a degree of superheat of 10° C., the coolant having passed through the evaporator 5c and in its gas-liquid two-phase (mixed) state or gas state has a temperature of 14° C. and returns to the inlet of the compressor 2 through the return path 13.

In the cooling apparatus of the present embodiment, the single compressor and the single decompressing unit are connected in series with each other, and the three evaporators are disposed downstream of the compressor and the decompressing unit and connected in series with each other. In addition, the hot gas that flows through the hot-gas bypass is joined with the coolant while the flow rate of the hot gas is adjusted by the decompressing unit, and the coolant and the hot gas is flowed into the most downstream evaporator. Since the two decompressing units are used for the three evaporators, a small and low-cost apparatus can be achieved. This is because the apparatus has fewer decompressing units, compared to the conventional cooling apparatus in which the evaporators are connected in parallel with each other. Note that the number of evaporators of the cooling apparatus of the present embodiment is not limited to three. Thus, if more evaporators are connected in series with each other, the above-described effects will increase more in a relative manner.

In the cooling apparatus of the present embodiment, an evaporator required to have the highest cooling capacity and high accuracy on the temperature control is disposed at the most downstream position. Thus, the cooling apparatus is useful and suitably used for various industrial apparatuses including an exposure device.

The most downstream evaporator is preferably used for an object to be cooled that needs the maximum amount of heat exchange, because the most downstream evaporator performs the hot-gas control and can cool the object with high accuracy so that the object has an optimum temperature. Thus, this arrangement can eliminate the heater and significantly reduce power consumption.

In addition, since the evaporator that performs the maximum amount of heat exchange is disposed at the most downstream position, the degree of superheat can be made higher, and the coolant can be easily gasified. Consequently, the compressor can be prevented from taking in a large amount of liquid-phase coolant, and thus from breaking down.

Note that when the temperature of an object to be cooled is adjusted into a predetermined temperature in a range equal to or larger than 21° C. and equal to or smaller than 25° C., it is preferable that the total amount of heat exchange of evaporators other than the most downstream evaporator be equal to or larger than one-ninth and equal to or smaller than one-fourth of the amount of heat exchange of the most downstream evaporator. If the total amount of heat exchange is less than one-ninth, a large amount of coolant flows also in the upstream evaporators for ensuring the heat exchange of the most downstream evaporator. As a result, the upstream evaporators may excessively cool respective objects. If the temperature of the excessively-cooled objects is adjusted by heating the objects by using a heater, the power consumption will increase. Thus, it is not preferable that the total amount of heat exchange is less than one-ninth. On the other hand, if the total amount of heat exchange is more than one-fourth, the coolant will be gasified by the upstream evaporators if the amount of the coolant that flows through the upstream evaporators corresponds to the amount of heat exchange of the most downstream evaporator. As a result, a necessary amount of coolant may not be supplied to the most downstream evaporator. Thus, it is preferable that the total amount be equal to or larger than one-ninth and equal to or smaller than one-fourth.

In addition, the cooling apparatus of the present embodiment has good operability when incorporated in an industrial apparatus and practically used. For example, when adjustment or maintenance is performed on an exposure device, the driving power system is stopped, but the other units are in operation. Thus, in some cases, it is necessary to keep the temperature of the other units and the temperature and cleanliness level of the atmosphere in the chamber. In this time, the liquid-cooling evaporator for the driving power system does not have to perform heat exchange because the object to be cooled has a low temperature, but the other evaporators have to perform normal operations. In the conventional cooling apparatus in which evaporators are disposed in parallel with each other, if the coolant continuously flows into the evaporator for the driving power system, the coolant that contains an excessive amount of liquid-phase coolant will return to the compressor. As a result, the compressor takes in the excessive amount of liquid-phase coolant, and may break down. For this reason, when adjustment or maintenance is performed on the exposure device, the coolant flow to the evaporator (the heat source of which has stopped) has to be stopped by using the stop valve. Thus, the operation of the conventional cooling apparatus is inconvenient.

In the present embodiment, however, even if the driving power system stops and the object B to be cooled has a low temperature, the detection unit 6 detects the temperature and/or the pressure of the coolant that returns to the compressor, and the control unit 12 monitors the degree of superheat and adjusts the degree of opening of the decompressing unit 4. Thus, in the cooling apparatus of the present embodiment, since the coolant that contains an excessive amount of liquid-phase coolant does not return to the compressor, no additional operation is needed for adjustment or maintenance. In addition to the exposure device, other industrial apparatuses are also often required to stop one unit for maintenance, inspection, or adjustment. Therefore, it can be said that the cooling apparatus of the present embodiment has good operability in practice.

Note that since the above-described numerical values of the pressure, the temperature, the cooling capacity, and the like are merely examples, the present embodiment is not limited to the examples.

Second Embodiment

In the cooling apparatus 1 of the first embodiment, temperature control is not performed on the object B' cooled by the evaporator 5b. Ina second embodiment, however, a heating unit that heats the cooled object is disposed for preventing the object B' from circulating in the industrial apparatus in a state where the object B' is overcooled.

Figure 4:
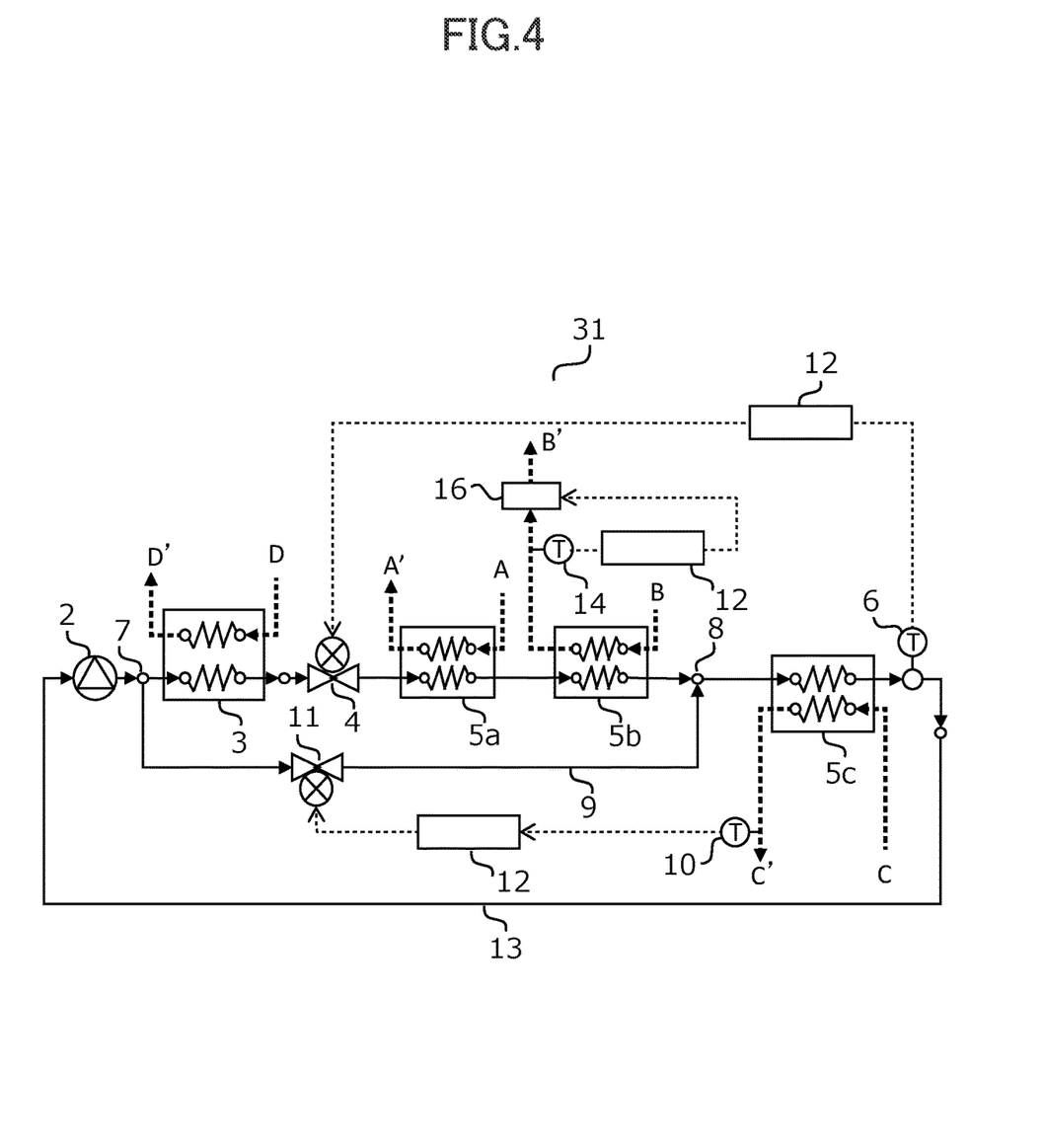
FIG. 4 illustrates a configuration of a cooling apparatus of a second embodiment.

FIG. 4 illustrates a configuration of a cooling apparatus 31 of the second embodiment. Note that the same component as that of the cooling apparatus 1 of the first embodiment is given the same reference numeral, and the description thereof will be omitted.

The second embodiment differs from the above-described first embodiment in that a temperature detection unit 14 and a heating unit 16 are disposed. The temperature detection unit 14 is disposed on a path of the object B' cooled by the evaporator 5b positioned upstream of the meeting point 8, for detecting the temperature of the object B'. The heating unit 16 is disposed downstream of the temperature detection unit 14 for heating the object B'. The heating unit 16 may be an electric heater. The temperature information detected by the temperature detection unit 14 is sent to the control unit 12, and the control unit 12 controls the heating intensity of the heating unit 16 so that the object B' has a predetermined temperature. Note that although the temperature detection unit 14 and the heating unit 16 are disposed only on the path of the object B' cooled by the evaporator 5b in FIG. 4, they may be disposed also on the path of the object cooled by the evaporator 5a. Thus, in the present embodiment, high-precision temperature control can be performed also on an object cooled by an evaporator other than the most downstream evaporator.

As in the first embodiment, since the cooling apparatus of the present embodiment also has a small size, good controllability for temperature adjustment, low cost, and good operability, the cooling apparatus can be suitably used for various industrial apparatuses including a semiconductor manufacturing apparatus.

Third Embodiment

Figure 5:
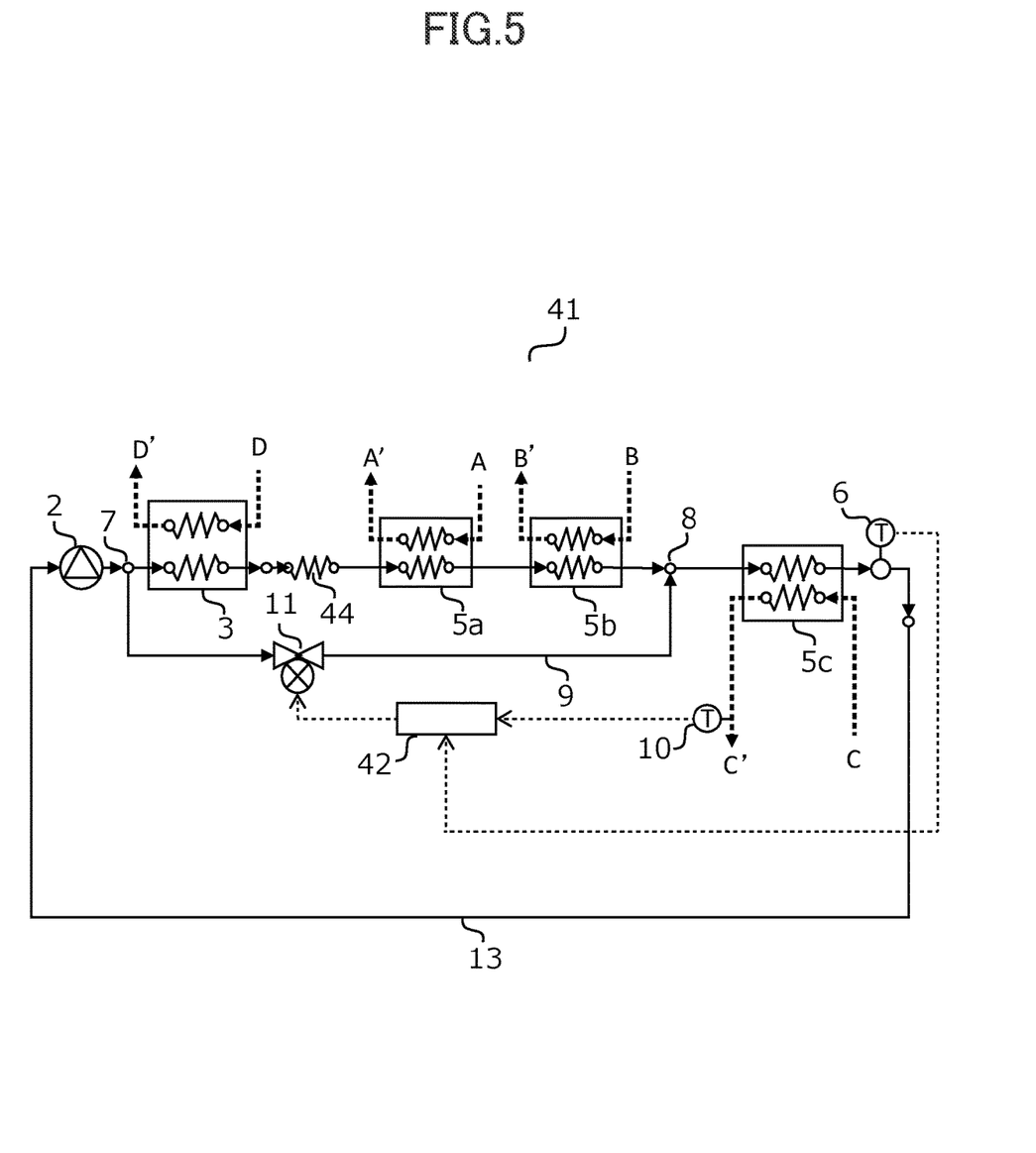
FIG. 5 illustrates a configuration of a cooling apparatus of a third embodiment.

A third embodiment differs from the first embodiment in configuration of the decompressing unit and method of controlling the decompressing unit. FIG. 5 illustrates a configuration of a cooling apparatus 41 of the third embodiment. Note that the same component as that of the cooling apparatus 1 of the first embodiment is given the same reference numeral, and the description thereof will be omitted.

In the third embodiment, a decompressing unit 44 disposed downstream of the condenser 3 decompresses the coolant to a constant pressure, instead of adjusting the pressure by the control unit controlling and changing the degree of opening of the decompressing unit 44. On the other hand, the degree of opening of the decompressing unit 11 disposed on the hot-gas bypass circuit is controlled by a control unit 42 as follows, depending on the temperature of the object C' cooled by the most downstream evaporator 5c and on the degree of superheat of the coolant that has flowed through the evaporator 5c.

Figure 6:
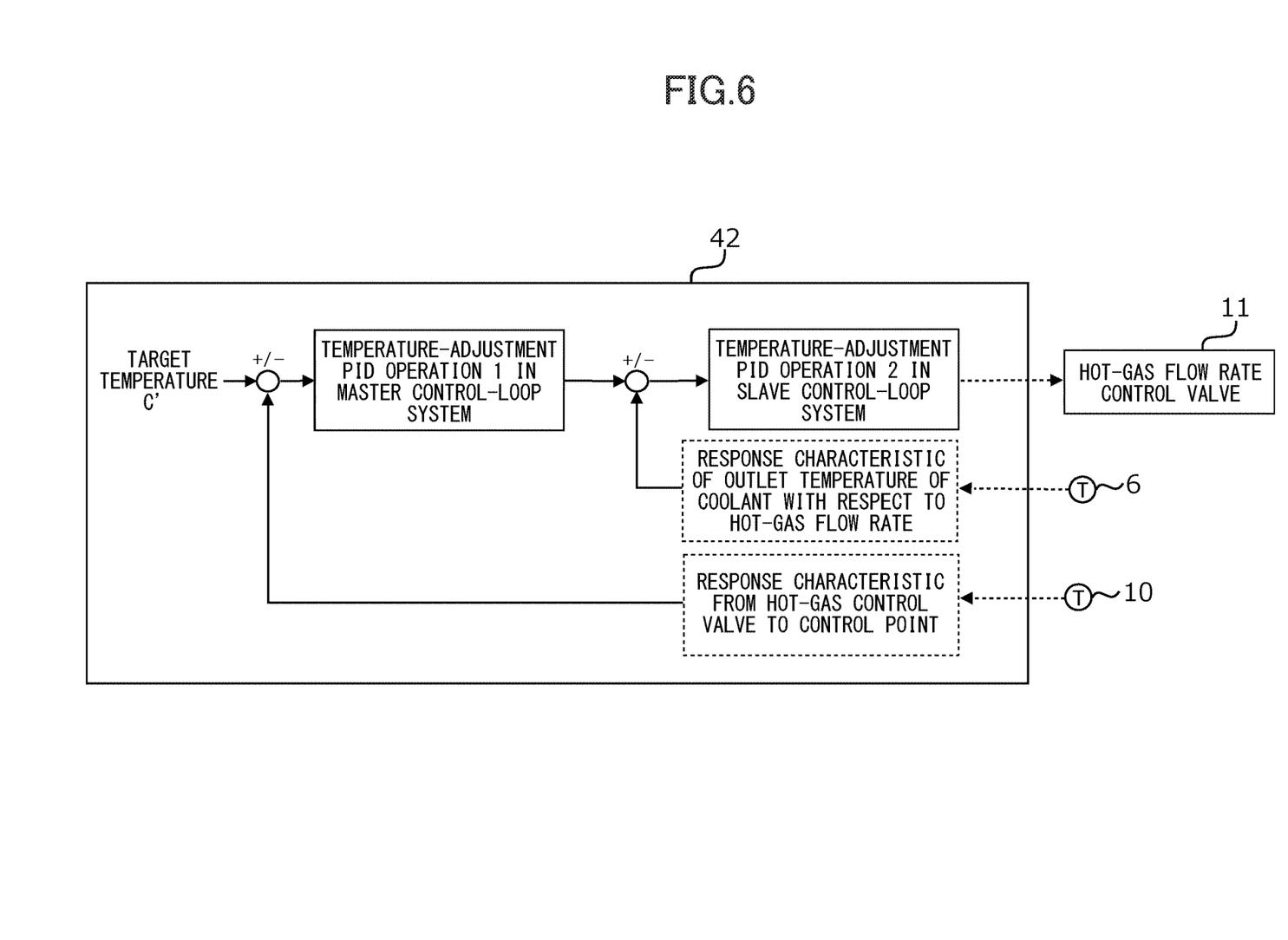
FIG. 6 is a schematic block diagram illustrating a control sequence of the third embodiment.

FIG. 6 is a schematic block diagram for illustrating a control sequence. First, the temperature of the object C' cooled by the evaporator 5c is detected by the temperature detection unit 10, and sent to the control unit 42. The control unit 42 performs feed-back control by performing PID operation including proportional operation, integral operation, and derivative operation, using the temperature information sent by the temperature control unit 10; and thereby determines a target degree of superheat of the coolant having passed through the evaporator 5c so that the temperature of the object C' has a predetermined target temperature (temperature-adjustment PID operation 1 in master control-loop system).

Then, the information on the temperature and/or the pressure detected by the detection unit 6 is sent to the control unit 42, and the control unit 42 calculates a degree of superheat from the detected temperature and/or pressure. The control unit 42 performs feed-back control by performing PID operation including proportional operation, integral operation, and derivative operation, using the calculated degree of superheat; and thereby determines the degree of opening of the decompressing unit 11 so that the degree of superheat of the coolant becomes the target degree of superheat determined in the master loop (temperature-adjustment PID operation 2 in slave control-loop system).

Since the cooling apparatus of the present embodiment performs the above-described cascade control by using the detected temperature information as a control parameter, the apparatus can more quickly respond to the change in disturbance and adjust the temperature. As in the first embodiment, since the cooling apparatus of the present embodiment also has a small size, good controllability for temperature adjustment, low cost, and good operability, the cooling apparatus can be suitably used for various industrial apparatuses including a semiconductor manufacturing apparatus.

Fourth Embodiment

Figure 7:
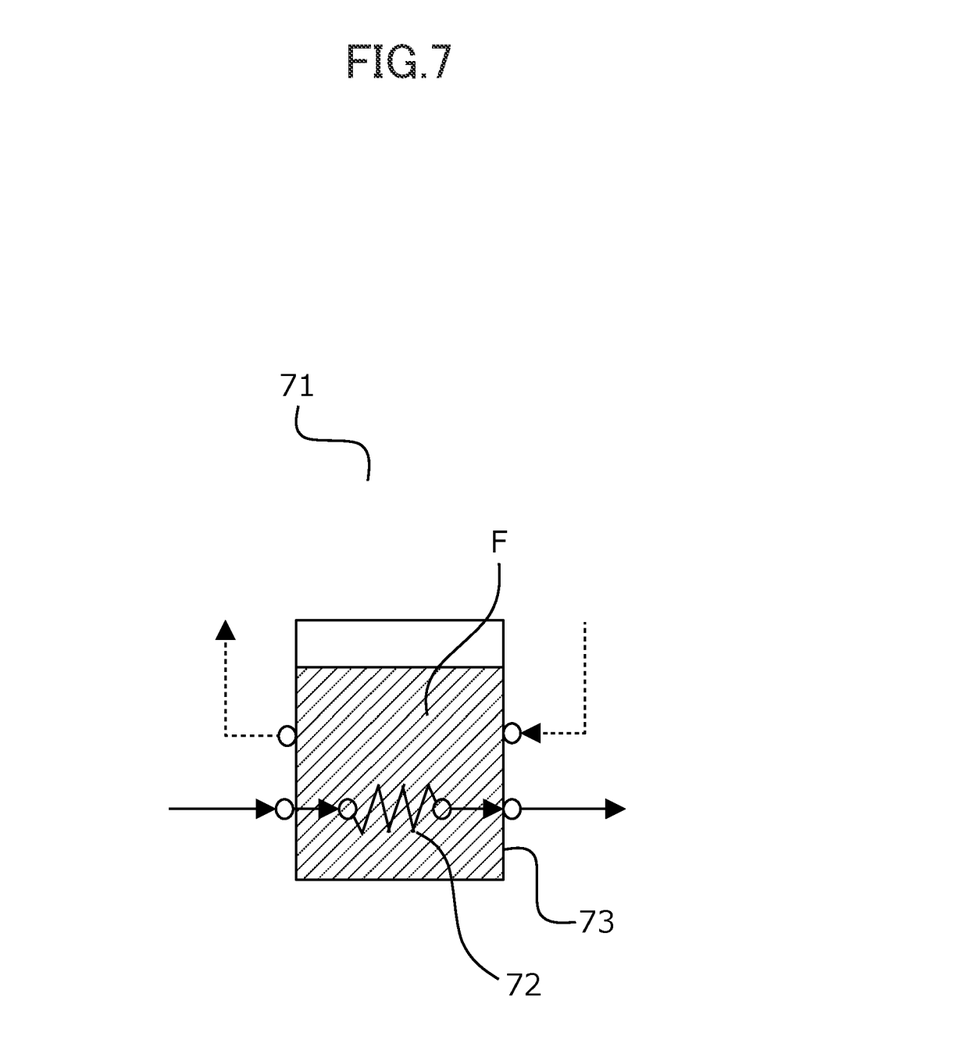
FIG. 7 illustrates an evaporator of a cooling apparatus of a fourth embodiment.

A fourth embodiment uses an evaporator 71 of FIG. 7, as an evaporator of the cooling apparatus.

The evaporator 71 illustrated in FIG. 7 can be suitably used for a case where a large amount of heat exchange is not needed and an object F to be cooled is liquid. Preferably, the object F to be cooled is cooling liquid having a high specific heat. The heat exchange is performed in a portion of a coolant pipe 72, and thus the portion is always soaked in the object F to be cooled. Thus, in the present embodiment, a tank is provided for storing a predetermined amount of object F to be cooled. The diameter of the coolant pipe 72 is equal to the diameter of the coolant pipe that passes through the evaporator 5c. This is because the diameter of the coolant pipe 72 is determined in reference to the coolant pipe that passes through the evaporator 5c, which performs a larger amount of heat exchange than the other evaporators. In addition, the portion of the coolant pipe 72, which is always soaked in the object F to be cooled, has a length that provides a contact area which allows the portion to perform a predetermined amount of heat exchange. The object F to be cooled is temporarily stored in a liquid storage tank 73. When requested by a heat source, the object F is sent toward the heat source by a necessary amount by a liquid-delivery pump (not illustrated); and the rest of the object F is stored in the liquid storage tank 73.

The evaporator of the fourth embodiment can be suitably used as an upstream evaporator of the first to the third embodiments. Even when the evaporator of the present embodiment is used, the cooling apparatus can also have a small size, good controllability for temperature adjustment, low cost, and good operability. Thus, the cooling apparatus can be suitably used for various industrial apparatuses including a semiconductor manufacturing apparatus.

Fifth Embodiment

Figure 8:
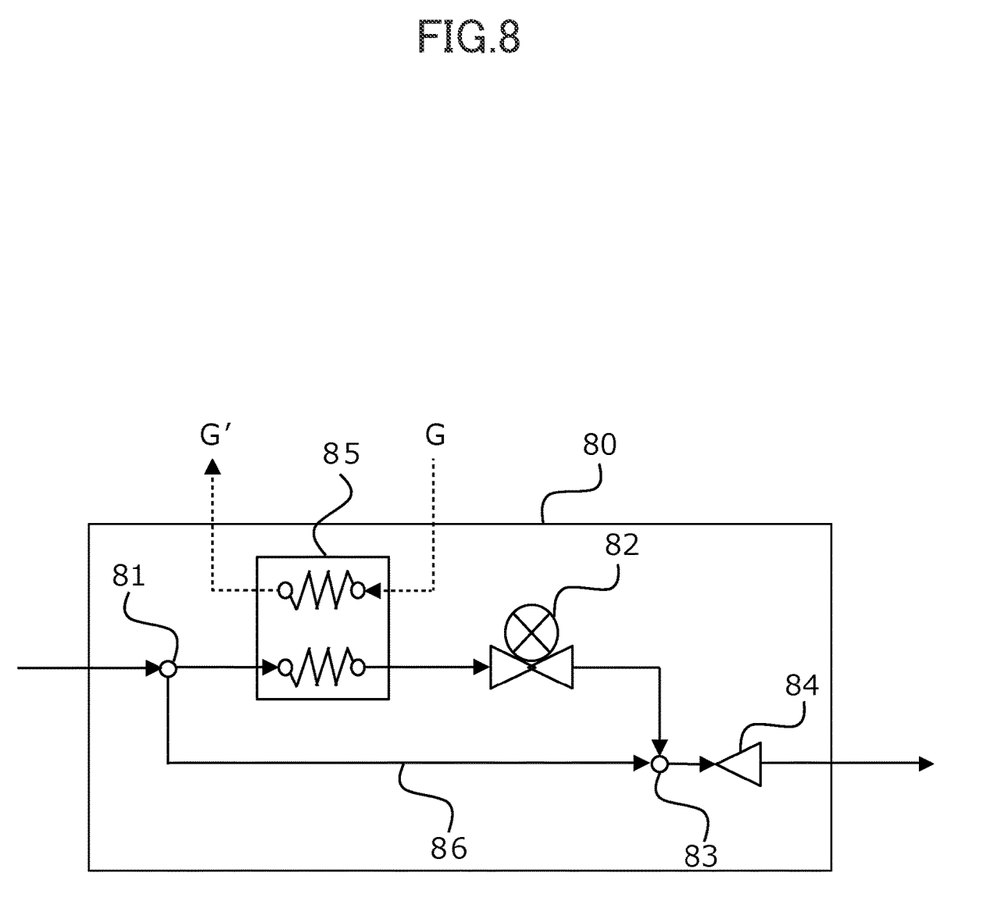
FIG. 8 illustrates an evaporator of a cooling apparatus of a fifth embodiment.

A fifth embodiment uses an evaporator 80 of FIG. 8, as an evaporator of the cooling apparatus. In a case where evaporators are connected in serial with each other, a sufficient flow rate of coolant is flowed for ensuring that all evaporators including the most downstream evaporator have sufficient cooling capacity. In this case, however, an upstream evaporator may cool an object excessively. While the second embodiment provides the heating unit for preventing an object to be cooled from being excessively cooled, the present embodiment provides a flow path of the coolant in the gas-liquid two-phase (mixed) state, devised for reducing power consumed by the heating unit.

In FIG. 8, a heat exchange unit 85 includes a flow path through which the coolant that has branched off at an inflow-side branch point 81 flows, and a flow path through which an object G to be cooled flows. The coolant performs heat exchange with the object G to be cooled, in the heat exchange unit 85. A throttle valve 82 is disposed downstream of the heat exchange unit 85 for reducing the flow rate of the coolant. The downstream side of the throttle valve 82 is connected to a meeting point 83. In addition, a bypass flow path 86 branches off at the inflow-side branch point 81, and extends to the meeting point 83 without passing through the heat exchange unit 85. In addition, a check valve 84 is disposed downstream of the meeting point 83.

The degree of opening of the throttle valve 82 is adjusted in advance so that a certain amount of coolant necessary to cool the object G flows in the heat exchange unit 85. The degree of opening of the throttle valve 82 is adjusted so that the coolant to pass through the heat exchange unit 85 keeps its latent heat state. In other words, the degree of opening is adjusted so as not to be excessively reduced for preventing the coolant from being gasified.

The present embodiment can perform the control that makes the amount of coolant closer to the optimum amount while keeping a sufficiently-large amount of coolant, which flows in the whole refrigeration cycle. Thus, the present embodiment can be suitably used for preventing the amount of heat exchange of the heat exchange unit from becoming too large.

The evaporator of the fifth embodiment can be suitably used as an upstream evaporator of the first to the third embodiments. Even when the evaporator of the present embodiment is used, the cooling apparatus can also have a small size, good controllability for temperature adjustment, low cost, and good operability. Thus, the cooling apparatus can be suitably used for various industrial apparatuses including a semiconductor manufacturing apparatus.

Sixth Embodiment

In a sixth embodiment, the cooling apparatus includes a supercooling apparatus interposed in the pipe that connects the condenser 3 and the decompressing unit 4 of FIG. 1. The high-temperature and high-pressure coolant is cooled and liquefied by the condenser 3, but is not completely liquefied. For this reason, the supercooling apparatus is disposed downstream of the condenser 3 for increasing the liquefaction ratio of the coolant in the gas-liquid two-phase (mixed) state. The increase in the liquefaction ratio increases cooling efficiency. Thus, in the cooling apparatus including the hot-gas bypass circuit, the increase in the liquefaction ratio can further reduce the power consumption in addition to the hot-gas bypass can reduce the power consumption. The system of the supercooling apparatus is not limited to a particular system as long as the system increases the liquefaction ratio of the coolant. For example, the system may be an air-cooling system, a water-cooling system, or a system in which the shape of the pipe for the coolant is changed for the cooling.

Other Embodiments

The cooling apparatus of the present invention can be suitably used for cooling heat-generating portions of an exposure device, a semiconductor manufacturing apparatus including an exposure device, or a display manufacturing apparatus including an exposure device. However, the embodiments are not limited to those for the device or the apparatus. The cooling apparatus can be suitably used for cooling heat-generating portions of various industrial apparatuses including a plurality of heat-generating portions, such as a light source, a heating source, a driving unit, and an electric circuit, that have different amounts of heat generation and need the cooling.

The present invention can be embodied by supplying a program that achieves one or more functions of the above-described embodiments, to a system or a device via a network or a recording media, and by causing one or more processors of a computer of the system or the device to read and execute the program. The present disclosure may be embodied by a circuit (such as an ASIC) that achieves one or more functions.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A cooling apparatus comprising:
    a compressor configured to compress coolant;
    a first flow path and a second flow path branched from a branch point, the branch point being disposed downstream of the compressor and configured to split compressed coolant toward the first and second flow paths;
    a condenser disposed downstream of the branch point in the first flow path and configured to condense compressed coolant;
    a first decompressor disposed downstream of the condenser and configured to decompress condensed coolant;
    three or more evaporators disposed downstream of the first decompressor and connected in series with each other such that the evaporators cool different objects to be cooled;
    a second decompressor disposed downstream of the branch point in the second flow path and configured to decompress compressed coolant;
    a return path configured to return coolant that flows out of a most downstream evaporator of the three or more evaporators, to the compressor;
    a first temperature detector configured to detect a temperature of an object cooled by the most downstream evaporator of the three or more evaporators;
    a detection unit configured to detect a temperature and/or a pressure of the coolant that flows out of the most downstream evaporator of the three or more evaporators; and
    a control unit,
    wherein the second flow path comprises a hot-gas flow path configured to extend directly from an outlet of the second decompressor to a sole meeting point with the first flow path, the sole meeting point being positioned downstream of at least one of the evaporators and between the most downstream evaporator and a second-most downstream evaporator of the three or more evaporators, and
    wherein the control unit is configured to control a degree of opening of the second decompressor depending on the temperature detected by the first temperature detector and control a degree of opening of the first decompressor depending on the temperature and/or the pressure detected by the detection unit.

2. The cooling apparatus according to claim 1, further comprising a second temperature detector and a heating unit, the second temperature detector being disposed on a path in which a cooled object cooled by an evaporator of the at least one of the evaporators disposed upstream of the sole meeting point flows, the second temperature detector being configured to detect a temperature of the cooled object, the heating unit being configured to heat the cooled object.

3. The cooling apparatus according to claim 1, wherein the control unit is configured to control the degree of opening of the first decompressor depending on the temperature and/or the pressure detected by the detection unit such that a degree of superheat of the coolant that flows out of the most downstream evaporator of the three or more evaporators is within a predetermined range.

4. The cooling apparatus according to claim 1, wherein at least one of the three or more evaporators comprises a heat exchange unit, a throttle valve disposed downstream of the heat exchange unit, a check valve disposed downstream of the throttle valve, and a bypass flow path configured to connect an upstream side of the heat exchange unit and a downstream side of the throttle valve.

5. The cooling apparatus according to claim 1, wherein the three or more evaporators comprise an evaporator configured to cool a liquid and an evaporator configured to cool a gas.

6. The cooling apparatus according to claim 5, wherein the evaporator configured to cool the liquid comprises a tank configured to store the liquid and a coolant pipe configured to be soaked in the liquid stored in the tank.

7. The cooling apparatus according to claim 1, wherein the most downstream evaporator of the three or more evaporators is configured to cool a gas.

8. The cooling apparatus according to claim 1, wherein the most downstream evaporator has a maximum cooling capacity in the three or more evaporators.

9. The cooling apparatus according to claim 8, wherein a total amount of heat exchange of evaporators of the three or more evaporators other than the most downstream evaporator is equal to or larger than one-ninth and equal to or smaller than one-fourth of an amount of heat exchange of the most downstream evaporator.

10. An exposure apparatus comprising:
    the cooling apparatus according to claim 1; and
    a plurality of heat-generating portions having different amounts of heat generation,
    wherein the cooling apparatus is configured to cool the plurality of heat-generating portions.

11. An industrial apparatus comprising:
    the cooling apparatus according to claim 1; and
    a plurality of heat-generating portions having different amounts of heat generation,
    wherein the cooling apparatus is configured to cool the plurality of heat-generating portions.

12. A cooling apparatus comprising:
    a compressor configured to compress coolant;
    a first flow path and a second flow path branched from a branch point, the branch point being disposed downstream of the compressor and configured to split compressed coolant toward the first and second flow paths;
    a condenser disposed downstream of the branch point in the first flow path and configured to condense compressed coolant;
    a first decompressor disposed downstream of the condenser and configured to decompress condensed coolant;
    three or more evaporators disposed downstream of the first decompressor and connected in series with each other such that the evaporators cool different objects to be cooled;
    a second decompressor disposed downstream of the branch point in the second flow path and configured to decompress compressed coolant;
    a return path configured to return coolant that flows out of a most downstream evaporator of the three or more evaporators, to the compressor;
    a first temperature detector configured to detect a temperature of an object cooled by the most downstream evaporator of the three or more evaporators;

a detection unit configured to detect a temperature and/or a pressure of the coolant that flows out of the most downstream evaporator of the three or more evaporators; and a control unit, wherein the second flow path comprises a hot-gas flow path configured to extend directly from an outlet of the second decompressor to a sole meeting point with the first flow path, the sole meeting point being positioned downstream of at least one of the evaporators and between the most downstream evaporator and a second-most downstream evaporator of the three or more evaporators, and wherein the control unit is configured to control a degree of opening of the second decompressor depending on the temperature detected by the first temperature detector and on the temperature and/or the pressure detected by the detection unit.

13. The cooling apparatus according to claim 12, wherein the control unit is configured to cascade-control the degree of opening of the second decompressor by using the temperature detected by the first temperature detector as a control parameter of a master control-loop system, and using the temperature and/or the pressure detected by the detection unit as a control parameter of a slave control-loop system.

14. The cooling apparatus according to claim 13, wherein the control unit is configured to perform PID operation including proportional operation, integral operation, and derivative operation, in control in the master control-loop system and the slave control-loop system.

* * * * *